(12) United States Patent
Mano et al.

(10) Patent No.: US 10,024,925 B2
(45) Date of Patent: Jul. 17, 2018

(54) CONTROL SYSTEM FOR BATTERY

(71) Applicant: TOYOTA JIDOSHA KABUSHIKI KAISHA, Toyota-shi, Aichi-ken (JP)

(72) Inventors: Ryo Mano, Toyota (JP); Teruo Ishishita, Miyoshi (JP); Hiroyuki Obata, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 18 days.

(21) Appl. No.: 15/200,707

(22) Filed: Jul. 1, 2016

(65) Prior Publication Data

US 2017/0010331 A1 Jan. 12, 2017

(30) Foreign Application Priority Data

Jul. 10, 2015 (JP) ................... 2015-138507

(51) Int. Cl.
*G01R 31/36* (2006.01)
*H01M 10/48* (2006.01)
*H01M 10/42* (2006.01)
*B60L 11/18* (2006.01)

(52) U.S. Cl.
CPC ........ *G01R 31/3675* (2013.01); *B60L 11/187* (2013.01); *H01M 10/425* (2013.01); *H01M 10/48* (2013.01); *H01M 10/486* (2013.01); *H01M 2010/4271* (2013.01); *H01M 2220/20* (2013.01)

(58) Field of Classification Search
CPC .......................... G01R 31/3675; H01M 10/48; H01M 10/486; H01M 10/425; H01M 2220/20; H01M 2010/4271; B60L 11/187
See application file for complete search history.

(56) References Cited

U.S. PATENT DOCUMENTS

| 2009/0184578 A1* | 7/2009 | Owens | H02J 1/14 307/10.7 |
| 2011/0213524 A1* | 9/2011 | Matsumoto | B60W 10/06 701/22 |
| 2012/0261397 A1* | 10/2012 | Schwarz | B60L 11/1875 219/202 |

FOREIGN PATENT DOCUMENTS

| JP | 2001-327002 A | 11/2001 |
| JP | 2005-037286 A | 2/2005 |
| JP | 2010-203854 A | 9/2010 |
| JP | 2011-512784 A | 4/2011 |
| WO | 2009/094367 A1 | 7/2009 |

* cited by examiner

*Primary Examiner* — Minh Phan
*Assistant Examiner* — Zannatul Ferdous
(74) *Attorney, Agent, or Firm* — Oliff PLC

(57) ABSTRACT

A control system for a battery includes a current sensor and an electronic control unit. The electronic control unit is configured to calculate a first error and a second offset error of the current sensor respectively based on outputs of the current sensor just before a stop of the electronic control unit and at startup of the electronic control unit. The electronic control unit is configured to correct an output of the current sensor by using a first error when a temperature of the current sensor at startup of the electronic control unit is higher than or equal to a threshold temperature, and correct the output of the current sensor by using a second error when the temperature of the current sensor at startup of the electronic control unit is lower than the threshold temperature.

4 Claims, 5 Drawing Sheets

CONTROL SYSTEM FOR BATTERY

INCORPORATION BY REFERENCE

The disclosure of Japanese Patent Application No. 2015-138507 filed on Jul. 10, 2015 including the specification, drawings and abstract is incorporated herein by reference in its entirety.

BACKGROUND OF THE INVENTION

1. Field of the Invention

The disclosure relates to a control system for a battery and, more particularly, to a technique for correcting an output of a current sensor that detects a charge and discharge current of a battery.

2. Description of Related Art

Japanese Patent Application Publication No. 2005-37286 (JP 2005-37286 A) describes a technique for, in a vehicle including an electrical load, a battery that stores electric power to be supplied to the electrical load, and a current sensor that detects a charge and discharge current of the battery, calculating a learned value of an offset error of the current sensor based on an output of the current sensor just before a stop of a vehicle system and then correcting the output of the current sensor by using the learned value of the offset error.

However, in the case where the vehicle system is started up in an extremely low temperature environment in which the outside air temperature is extremely low, if the output of the current sensor is corrected by using the learned value of the offset error as in the case of JP 2005-37286 A, there is a concern that correction accuracy decreases.

That is, the offset error of the current sensor generally changes in response to the temperature of the current sensor. The temperature of the current sensor mainly depends on the outside air temperature at startup of the vehicle system, and gradually converges (saturates) to a steady temperature after the startup. Therefore, when the vehicle system has been started up after being left to stand in an extremely low temperature environment, the temperature of the current sensor just after the startup is considerably lower than the steady temperature, and accordingly it is assumed that the offset error just after the startup also considerably deviates from the learned value of the offset error (offset error just before a stop of the current sensor). Therefore, in the case where the vehicle system has been started up after being left to stand in an extremely low temperature environment, if the output of the current sensor is corrected by using the learned value of the offset error (the offset error of the current sensor just before a stop of the vehicle system), it is assumed that the output of the current sensor is not accurately corrected.

SUMMARY OF THE INVENTION

The disclosure is contemplated in order to solve the above-described inconvenience, and it is an object of the disclosure to accurately correct an output of a current sensor in the case where a vehicle system has been started up in an environment in which an outside air temperature is low.

A control system according to this disclosure is a control system for a battery that stores electric power for generating a vehicle driving force. The control system includes a current sensor that detects a charge and discharge current of the battery, and an electronic control unit configured to start up or stop in response to an operation conducted by a user. The electronic control unit is configured to execute first correction control when a temperature of the current sensor at startup of the electronic control unit is higher than or equal to a threshold temperature, and execute second correction control when the temperature of the current sensor at startup of the electronic control unit is lower than the threshold temperature. The first correction control is control for correcting the output of the current sensor by using a first error that is an offset error of the current sensor and that is calculated based on the output of the current sensor just before a stop of the electronic control unit. The second correction control is control for correcting the output of the current sensor by using a second error that is an offset error of the current sensor and that is determined based on the output of the current sensor at startup of the electronic control unit.

With the above configuration, when the temperature of the current sensor at startup of the electronic control unit is lower than the threshold temperature, the second correction control is executed. In the second correction control, the output of the current sensor is corrected by using the second error (the offset error of the current sensor, which is determined based on the output of the current sensor at startup of the electronic control unit). For this reason, in comparison with the case where the first correction control for correcting the output of the current sensor by using the first error (the offset error of the current sensor, which is calculated based on the output of the current sensor just before a stop of the electronic control unit), it is possible to accurately correct the output of the current sensor.

The output of the current sensor may be a positive value during discharging of the battery and may be a negative value during charging of the battery. The first correction control may be control for setting a value obtained by subtracting the first error from the output of the current sensor as a corrected charge and discharge current of the battery. The second correction control may be control for setting a value obtained by subtracting the second error from the output of the current sensor as a corrected charge and discharge current of the battery. The electronic control unit may be configured to execute the second correction control when the temperature of the current sensor at startup of the electronic control unit is lower than the threshold temperature and the second error is smaller than the first error.

When the second error is smaller than the first error, if the first correction control is executed, although the corrected current becomes a negative value under the first correction control and it indicates that the battery is being charged, the actual current becomes a positive value and the battery continues to be discharged, with the result that there is a concern that the amount of charge of the battery decreases to a lower limit value or below. However, with the above configuration, when the second error is smaller than the first error, not the first correction control but the second correction control is executed. Thus, it is possible to accurately correct the output of the current sensor in comparison with the case where the first correction control is executed, so it is possible to prevent the amount of charge of the battery from becoming lower than the lower limit value.

The electronic control unit may be configured to, when the temperature of the current sensor exceeds the threshold temperature during execution of the second correction control, stop the second correction control and execute the first correction control.

With the above configuration, when the temperature of the current sensor exceeds the threshold temperature during execution of the second correction control, it is determined that the first error is closer to the actual offset error than the second error, and correction control is switched from the second correction control to the first correction control. For this reason, in comparison with the case where execution of the second correction control is continued, it is possible to accurately correct the output of the current sensor.

The control system may further include a temperature sensor that detects the temperature of the battery. The electronic control unit may be configured to estimate the temperature of the current sensor based on the output of the temperature sensor.

With the above configuration, it is possible to accurately correct the output of the current sensor without providing an exclusive sensor that detects the temperature of the current sensor.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
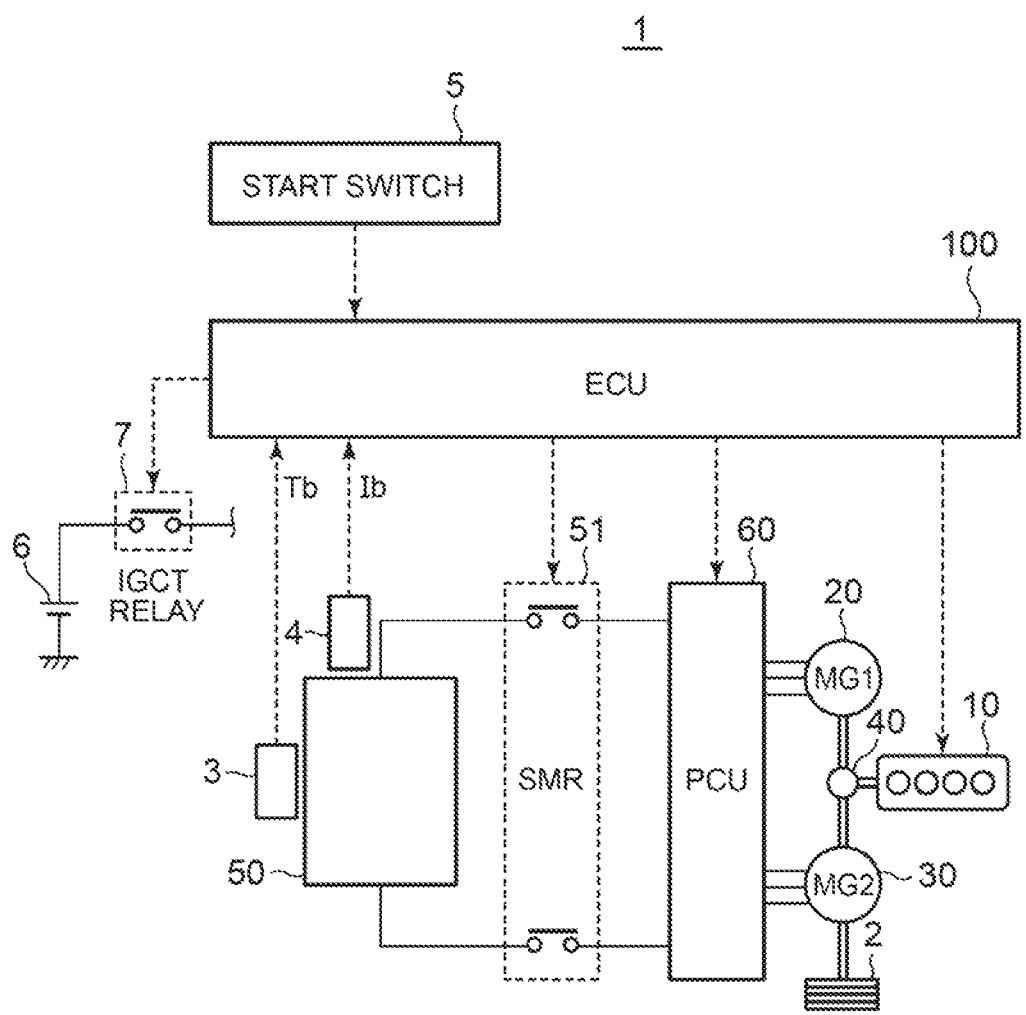
FIG. 1 is an overall configuration view of a vehicle.

Hereinafter, an embodiment of the disclosure will be described in detail with reference to the accompanying drawings. Like reference numerals denote the same or corresponding portions in the drawings, and the description thereof will not be repeated.

FIG. 1 is an overall configuration view of a vehicle 1 on which a control system according to the embodiment of the disclosure is mounted. The vehicle 1 includes an engine 10, a first motor generator (hereinafter, also referred to as first MG) 20, a second motor generator (hereinafter, also referred to as second MG) 30, a power split device 40, a power control unit (PCU) 60, a drive battery 50, a system main relay (hereinafter, also referred to as SMR) 51, and an electronic control unit (hereinafter, also referred to as ECU) 100.

The vehicle 1 is a hybrid vehicle that travels by using power that is output from at least one of the engine 10 and the second MG 30. The vehicle to which this disclosure is applicable is not limited to the hybrid vehicle shown in FIG. 1, and may be a hybrid vehicle having another configuration or an electric vehicle that does not include an engine and that includes a motor generator.

The power of the engine 10 is split by the power split device 40 and distributed between a path through which power is transmitted to a drive wheel 2 and a path through which power is transmitted to the first MG 20.

The first MG 20 generates electric power by using the power of the engine 10, split by the power split device 40. The second MG 30 generates power by using at least one of electric power stored in the drive battery 50 and electric power generated by the first MG 20. The power of the second MG 30 is transmitted to the drive wheel 2. For example, during braking of the vehicle 1, the second MG 30 is driven by the drive wheel 2, and the second MG 30 operates as a generator. Thus, the second MG 30 also functions as a regenerative brake that converts the kinetic energy of the vehicle to electric power. Regenerated electric power generated by the second MG 30 is stored in the drive battery 50.

The PCU 60 converts electric power between the drive battery 50 and each of the first MG 20 and the second MG 30. When the PCU 60 is operated, the first MG 20 or the second MG 30 or both are driven by electric power stored in the drive battery 50 or the drive battery 50 is charged with electric power generated by the first MG 20 or the second MG 30 or both.

The drive battery 50 is a secondary battery that stores electric power for driving the first MG 20 and the second MG 30. The drive battery 50 typically includes a lithium ion battery cell or a nickel-metal hydride battery cell. The drive battery 50 is connected to the PCU 60 via the SMR 51.

The SMR 51 is opened or closed in response to a control signal from the ECU 100. When the SMR 51 is closed, the drive battery 50 is connected to the PCU 60. When the SMR 51 is opened, the drive battery 50 is disconnected from the PCU 60.

The vehicle 1 further includes a temperature sensor 3, a current sensor 4, a start switch 5, an auxiliary battery 6, and an IGCT relay 7. The temperature sensor 3 detects the temperature of the drive battery 50 (hereinafter, also referred to as battery temperature Tb), and outputs the detected temperature to the ECU 100.

The current sensor 4 detects the charge and discharge current of the drive battery 50 (hereinafter, also referred to as battery current Ib), and outputs the detected charge and discharge current to the ECU 100. Hereinafter, description will be made on the assumption that the battery current Ib that is the output of the current sensor 4 is a positive value during discharging of the drive battery 50 and is a negative value during charging of the drive battery 50. The voltage of the drive battery 50 is detected by a voltage sensor (not shown).

The start switch 5 is an operation switch for allowing a user to conduct ignition (IG) ON operation or IG OFF operation. The IG ON operation is an operation to set the vehicle 1 to a drivable state (ready-ON state) by starting up a vehicle system (a device for causing the vehicle 1 to travel) including the ECU 100. The IG OFF operation is an operation to set the vehicle 1 to a non-drivable state (ready-OFF state) by stopping the vehicle system.

The auxiliary battery 6 is a secondary battery that stores relatively low-voltage electric power for operating auxiliaries of the vehicle 1. The auxiliary battery 6 typically includes a lead storage battery. The auxiliary battery 6 is connected to the auxiliaries via the IGCT relay 7.

The IGCT relay 7 is closed in response to the IG ON operation, and is opened in response to a control signal from the ECU 100. As the IGCT relay 7 is switched from an open state to a closed state, the auxiliary battery 6 is connected to the auxiliaries, and electric power is supplied from the auxiliary battery 6 to the auxiliaries, with the result that the vehicle system including the ECU 100 is started up. As the IGCT relay 7 is switched from the closed state to the open state, the auxiliary battery 6 is disconnected from the auxiliaries, with the result that the vehicle system is stopped.

The ECU 100 includes a central processing unit (CPU) (not shown) and a memory (not shown), and controls the devices of the vehicle 1 based on information stored in the memory and information from the sensors.

As the vehicle system including the ECU 100 is started up in response to the IG ON operation, the ECU 100 sets the vehicle 1 to the ready-ON state by closing the SMR 51.

In the ready-ON state, the ECU 100 sets an allowable input power WIN (in watt) of the drive battery 50 based on the battery temperature Tb, and the like. For example, the ECU 100 sets the allowable input power WIN to a smaller value as the battery temperature Tb decreases. The ECU 100 controls the PCU 60 such that electric power that is input to the drive battery 50 does not exceed the allowable input power WIN.

Similarly, the ECU 100 sets an allowable output power WOUT (in watt) of the drive battery 50 based on the battery temperature Tb, and the like. For example, the ECU 100 sets the allowable output power WOUT to a smaller value as the battery temperature Tb decreases. The ECU 100 controls the PCU 60 such that electric power that is output from the drive battery 50 does not exceed the allowable output power WOUT.

As the IG OFF operation is conducted by a user in the ready-ON state, the ECU 100 sets the vehicle 1 to the ready-OFF state by opening the SMR 51. After the vehicle 1 is set to the ready-OFF state as a result of opening the SMR 51, the ECU 100 stops the vehicle system including the ECU 100 by opening the IGCT relay 7.

The output of the current sensor 4 includes a so-called offset error. That is, the battery current Ib detected by the current sensor 4 is a value that deviates by the magnitude of the offset error in a positive direction or a negative direction with respect to an actual charge and discharge current (hereinafter, also referred to as actual current) of the drive battery 50. The positive direction is a direction in which the value of the battery current Ib increases, that is, a direction in which the absolute value of the battery current Ib increases during discharging (when the battery current Ib is a positive value) and a direction in which the absolute value of the battery current Ib reduces during charging (when the battery current Ib is a negative value). On the other hand, the negative direction is a direction in which the value of the battery current Ib reduces, that is, a direction in which the absolute value of the battery current Ib reduces during discharging and a direction in which the absolute value of the battery current Ib increases during charging.

The offset error of the current sensor 4 has such characteristics that the offset error changes in response to the temperature of the current sensor 4. After traveling (after usage) for a long time, the temperature of the current sensor 4 presumably converges to substantially a steady temperature, so the offset error also presumably converges to substantially a steady value. Because the vehicle system is stopped after the SMR 51 is opened as described above, the SMR 51 is open and the actual current is zero just before a stop of the vehicle system. For this reason, the output of the current sensor 4 (battery current Ib) just before the vehicle system is stopped after traveling (after usage) for a long time is a value that indicates the offset error at the time when the temperature of the current sensor 4 has converged to the steady temperature.

The ECU 100 acquires the battery current Ib just before a stop of the vehicle system each time the vehicle system is stopped, and calculates a learned value of the offset error (hereinafter, referred to as learned offset error α or simply referred to as learned error α) of the current sensor 4 based on the acquired battery current Ib. For example, the ECU 100 calculates a value, obtained by filtering the plurality of battery currents Ib acquired each time the vehicle system is stopped, as the learned error α. For example, first-order lag processing, second-order lag processing, moving average process, and the like, may be used as the filtering. The ECU 100 stores the calculated learned error α in the memory.

During operation of the vehicle system, the ECU 100 reads the learned error α stored in the memory, and corrects the battery current Ib by using the learned error α. Specifically, the ECU 100 sets a value obtained by subtracting the learned error α from the output of the current sensor 4 as a corrected battery current Ib. Thus, the influence of the offset error is removed from the battery current Ib, so the detection accuracy of the current sensor 4 is ensured. Hereinafter, this series of control is referred to as ordinary correction control.

As described above, the offset error of the current sensor 4 changes in response to the temperature of the current sensor 4. The temperature of the current sensor 4 mainly depends on an outside air temperature at startup of the vehicle system (at startup of the ECU 100). The temperature of the current sensor 4 depends on the battery temperature Tb, and the like, during operation of the vehicle system, and gradually converges (saturates) to a steady temperature. Therefore, when the vehicle system is started up after being left to stand at an extremely low temperature at which the outside air temperature is extremely low, the temperature of the current sensor 4 just after the startup of the vehicle system is considerably lower than the steady temperature, and accordingly it is assumed that the offset error of the current sensor 4 just after the startup of the vehicle system also considerably deviates from the learned error α. Therefore, in the case where the vehicle system is started up after being left to stand at an extremely low temperature, if the battery current Ib is corrected by using the learned error α, it is assumed that the battery current Ib is not accurately corrected.

In consideration of such inconvenience, the ECU 100 according to the present embodiment executes not the above-described ordinary correction control but the following startup correction control when the temperature of the current sensor 4 at startup of the vehicle system (at the time when the ECU 100 is switched from a stopped state to an operating state) is lower than a threshold temperature T0.

In the present embodiment, the temperature of the current sensor 4 (hereinafter, also referred to as current sensor temperature Ti) is estimated based on the battery temperature Tb. For example, in an extremely low temperature environment in which the battery temperature Tb is lower than the threshold temperature T0, the current sensor temperature Ti is estimated as the same value as the battery temperature Tb.

An exclusive sensor that detects the current sensor temperature Ti may be provided, and it may be determined whether the current sensor temperature Ti detected by the sensor is lower than the threshold temperature T0.

The startup correction control is control for correcting the battery current Ib by using the offset error (hereinafter, also referred to as startup offset error β or simply startup error β) determined based on the battery current Ib at startup of the vehicle system. More specifically, the startup correction control is control for acquiring the battery current Ib at startup of the vehicle system as the startup error β and then correcting the battery current Ib by using the startup error β. That is, at startup of the vehicle system, the SMR 51 is open, and the actual current is zero, so the battery current β at startup of the vehicle system is just a value that indicates the offset error at startup of the vehicle system. In consideration of this point, the ECU 100 sets the battery current β acquired at startup of the vehicle system as the startup error β, and then sets a value obtained by subtracting the startup error β from the output of the current sensor 4 during operation of the vehicle system as the corrected battery current Ib. For this reason, in comparison with the case where the ordinary correction control for correcting the battery current Ib by using the learned error α is executed, it is possible to accurately correct the battery current Ib.

Figure 2:
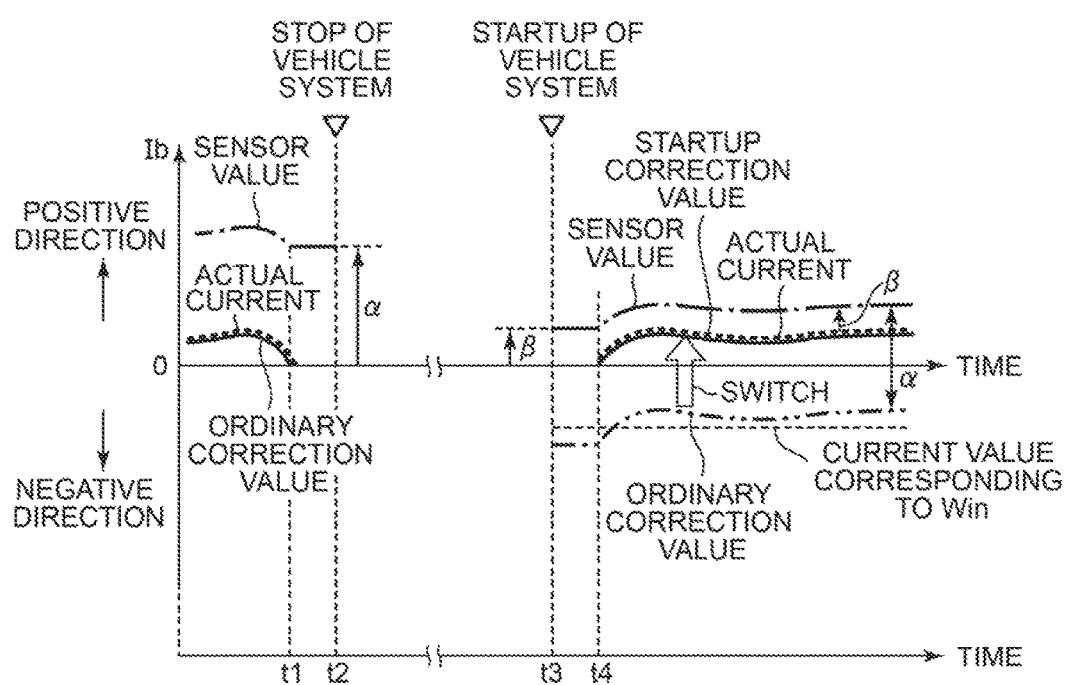
FIG. 2 is a view that shows an example of a change in battery current Ib under ordinary correction control and startup correction control.

FIG. 2 is a view that shows an example of a change in battery current Ib under the ordinary correction control and the startup correction control. In FIG. 2, the abscissa axis represents time, and the ordinate axis represents battery current Ib. In FIG. 2, a sensor value indicates the battery current Ib detected by the current sensor 4, an ordinary correction value indicates the battery current Ib corrected under the ordinary correction control (=Sensor value−Learned error α), and a startup correction value indicates the battery current Ib corrected under the startup correction control (=Sensor value−Startup error β).

As the IG OFF operation is conducted at time t1 at which the vehicle system is in operation, the SMR 51 is opened to set the vehicle 1 to the ready-OFF state. After that, at time t2, the IGCT relay 7 is opened to stop the vehicle system. The learned error α is calculated based on the battery current Ib just before a stop of the vehicle system (time t2), and is stored in the memory. For the sake of easy understanding, FIG. 2 shows the case where the battery current Ib just before a stop of the vehicle system (time t2) is the learned error α.

After that, it is assumed that the vehicle 1 is left to stand for an extended period of time in an extremely low temperature environment and the temperature of the current sensor 4 is also an extremely low temperature. As the IG ON operation is conducted at time t3 thereafter, the IGCT relay 7 is closed, and the vehicle system starts up. At time t4 thereafter, the SMR 51 is closed, and the vehicle 1 is set to the ready-ON state.

At startup of the vehicle system (time t3), the temperature of the current sensor 4 is extremely low, and the startup error β is considerably smaller than the learned error α that is stored in the memory. Therefore, just after the startup of the vehicle system, the ordinary correction value considerably deviates from the actual current.

Particularly, as shown in FIG. 2, when the allowable input power WIN is set to an extremely small value in an extremely low temperature environment and the startup error β is smaller than the learned error α (when the startup error β is on the negative side), there occurs an event that the actual current is a positive value although the ordinary correction value is a negative value and indicates that the drive battery 50 is being charged. If such an event (an event that the actual current is a positive value although the ordinary correction value is a negative value) occurs, although the ECU 100 recognizes that the drive battery 50 is being charged, electric power actually continues to be minutely discharged from the drive battery 50, and there is a concern that the amount of charge of the drive battery 50 (hereinafter, also referred to as battery SOC) depletes (becomes lower than a lower limit value).

When the current sensor temperature Ti at startup of the vehicle system is lower than the threshold temperature T0, not the above-described ordinary correction control but the startup correction control is executed. Thus, the startup correction value closer to the actual current than the ordinary correction value is treated as the corrected battery current Ib. As a result, the battery current Ib is accurately corrected, so the above-described event does not occur, and it is possible to prevent depletion of the battery SOC.

Figure 3:
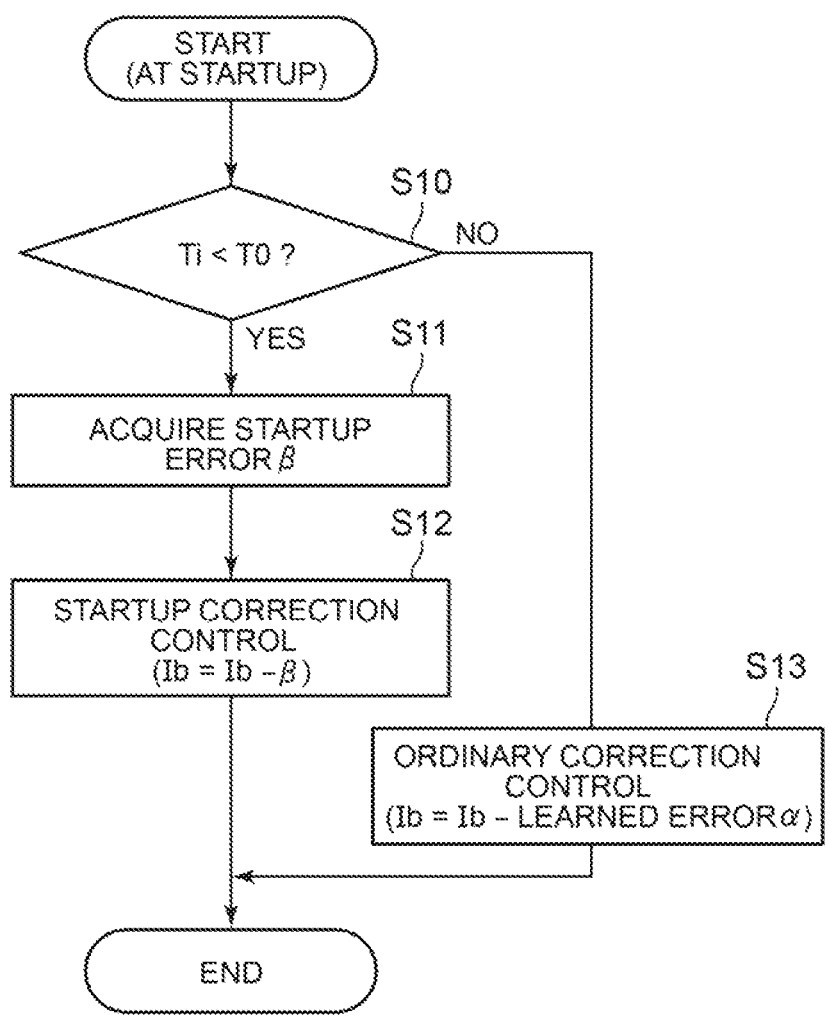
FIG. 3 is a first flowchart that shows the procedure of an electronic control unit.

FIG. 3 is a flowchart that shows the procedure that is executed by the ECU 100 according to the present embodiment. The process of this flowchart is started at startup of the vehicle system.

In step (hereinafter, step is abbreviated as "S") 10, the ECU 100 determines whether the current sensor temperature Ti is lower than the threshold temperature T0. The threshold temperature T0 is set in advance from the viewpoint that which one of the ordinary correction control and the startup correction control more accurately corrects the battery current Ib. As described above, in the present embodiment, the current sensor temperature Ti is estimated based on the battery temperature Tb.

When the current sensor temperature Ti is lower than the threshold temperature T0 (YES in S10), the ECU 100 acquires and stores the battery current Ib at startup of the vehicle system as the startup error β in S11, and executes the startup correction control in S12. That is, after startup of the vehicle system, the ECU 100 sets a value obtained by subtracting the startup error β from the output of the current sensor 4 as the corrected battery current Ib.

On the other hand, when the current sensor temperature Ti is higher than or equal to the threshold temperature T0 (NO in S10), the ECU 100 executes the ordinary correction control in S13. That is, after startup of the vehicle system, the ECU 100 sets a value obtained by subtracting the learned error α from the output of the current sensor 4 as the corrected battery current Ib.

In the present embodiment, correction control (any one of the startup correction control and the ordinary correction control) selected in response to the current sensor temperature Ti at startup of the vehicle system is kept until the vehicle system is stopped next time.

As described above, according to the present embodiment, when the current sensor temperature Ti at startup of the vehicle system is lower than the threshold temperature T0, not the ordinary correction control that uses the learned error α but the startup correction control that uses the startup error β is executed. For this reason, in comparison with the case where the ordinary correction control is executed, it is possible to accurately correct the battery current Ib.

The current sensor temperature Ti is estimated based on the battery temperature Tb. For this reason, it is possible to accurately correct the output of the current sensor 4 without providing an exclusive temperature sensor that detects the current sensor temperature Ti.

The above-described embodiment may be, for example, modified as follows. In the above-described embodiment, when the current sensor temperature Ti at startup of the vehicle system is lower than the threshold temperature T0 (when the current sensor 4 is in an extremely low temperature environment), the startup correction control is executed.

However, as described with reference to FIG. 2, there is a possibility that the event that the actual current is a positive value although the ordinary correction value is a negative value (the event that causes the battery SOC to deplete) occurs when the startup error β is smaller than the learned error α. Therefore, from the viewpoint of preventing depletion of the battery SOC, the startup correction control may be executed when the current sensor temperature Ti at startup of the vehicle system is lower than the threshold temperature T0 and the startup error β is smaller than the learned error α.

Because each of the startup error β and the learned error α is a value including both positive and negative signs, the case where the startup error β is smaller than the learned error α includes (a) the case where both the startup error β and the learned error α are positive values and the absolute value of the startup error is smaller than the absolute value of the learned error α, (b) the case where the startup error β is a negative value and the learned error α is a positive value, and (c) both the startup error β and the learned error α are negative values and the absolute value of the startup error β is larger than the absolute value of the learned error α. FIG. 2 illustrates the case of the above (a).

Figure 4:
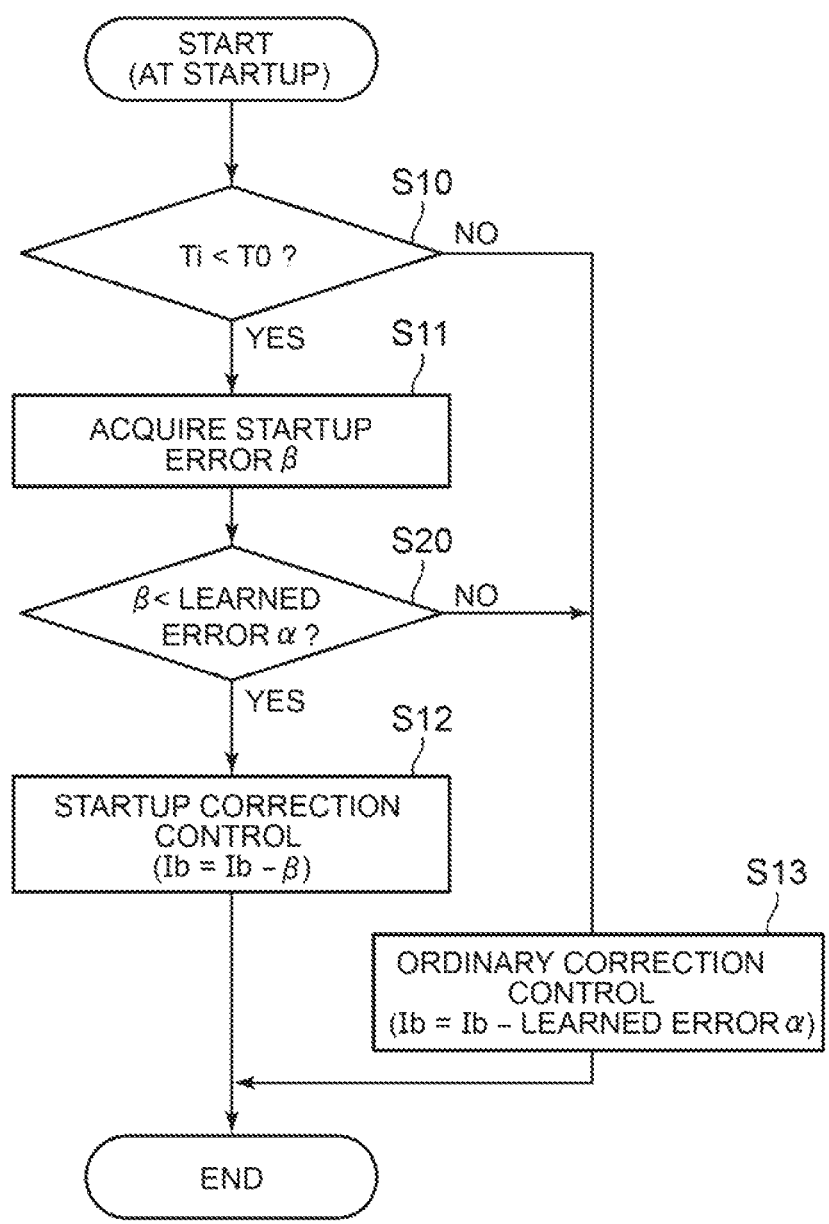
FIG. 4 is a second flowchart that shows the procedure of the electronic control unit.

FIG. 4 is a flowchart that shows a procedure that is executed by the ECU 100 according to the present alternative embodiment. The flowchart of FIG. 4 differs from the above-described flowchart of FIG. 3 in that the process of S20 is added. The other steps are the same as those of the above-described flowchart of FIG. 3, so the detailed description will not be repeated.

When the current sensor temperature Ti at startup of the vehicle system is lower than the threshold temperature T0 (YES in S10), the ECU 100 acquires and stores the battery current Ib at startup of the vehicle system as the startup error β in S11.

After that, the ECU 100 determines in S20 whether the startup error β is smaller than the learned error α.

When the startup error β is smaller than the learned error α (YES in S20), there is a high possibility that the event that the actual current is a positive value although the ordinary correction value is a negative value (the event that causes the battery SOC to deplete) occurs, so the ECU 100 executes the startup correction control in S12.

On the other hand, when the startup error β is larger than or equal to the learned error α (NO in S20), there is a low possibility that the event that the actual current is a positive value although the ordinary correction value is a negative value (the event that causes the battery SOC to deplete) occurs, so the ECU 100 executes the ordinary correction control in S13.

With such a modification, it is possible to appropriately select one of the startup correction control and the ordinary correction control based on whether there is a high possibility that the event that the actual current is a positive value although the ordinary correction value is a negative value occurs.

In the above-described embodiment, when the current sensor temperature Ti at startup of the vehicle system is lower than the threshold temperature T0, the startup correction control is selected, and the startup correction control is kept until the vehicle system is stopped next time.

However, when the current sensor temperature Ti exceeds the threshold temperature T0 by the time the vehicle system is stopped next time, it may be determined that the learned error α is closer to the actual offset error than the startup error β, and correction control may be switched from the startup correction control to the ordinary correction control.

Figure 5:
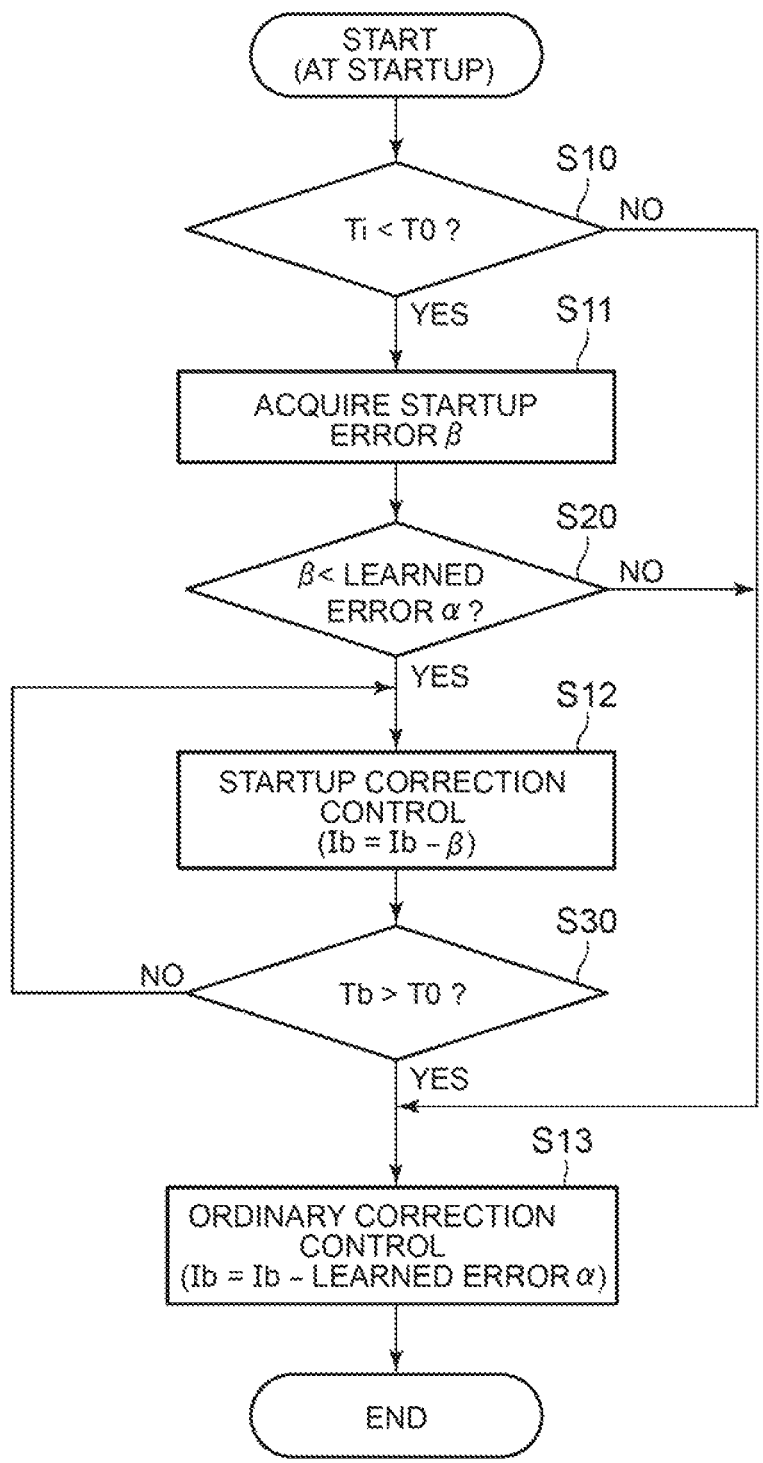
FIG. 5 is a third flowchart that shows the procedure of the electronic control unit.

FIG. 5 is a flowchart that shows a procedure that is executed by the ECU 100 according to the present alternative embodiment. Among the steps shown in FIG. 5, the steps to which the same step numbers as shown in FIG. 3 or FIG. 4 are assigned are already described, so the detailed description thereof will not be repeated.

In S30, the ECU 100 determines whether the current sensor temperature Ti exceeds the threshold temperature T0 during execution of the startup correction control. When the current sensor temperature Ti does not exceed the threshold temperature T0 (NO in S30), the ECU 100 returns the process to S12, and continues execution of the startup correction control.

When the current sensor temperature Ti exceeds the threshold temperature T0 (YES in S30), the ECU 100 stops execution of the startup correction control and executes the ordinary correction control in S13. For this reason, in comparison with the case where execution of the startup correction control is continued even when the current sensor temperature Ti exceeds the threshold temperature T0, it is possible to accurately correct the output of the current sensor 4.

The above-described embodiment and alternative embodiments to the embodiment may be combined with each other as needed without no technical contradiction.

The embodiment described above should be regarded as only illustrative in every respect and not restrictive. The scope of the disclosure is defined by the appended claims rather than the above description. The scope of the disclosure is intended to encompass all modifications within the scope of the appended claims and equivalents thereof.

The embodiment is summarized. A vehicle includes a drive battery, a current sensor that detects a charge and discharge current of the drive battery, and an electronic control unit that executes ordinary correction control for correcting an output of the current sensor by using an ordinary offset error calculated based on the output of the current sensor just before a stop of a vehicle system. When a temperature of the current sensor at startup of the vehicle system is lower than a threshold temperature, the electronic control unit executes not the ordinary correction control but startup correction control. The startup correction control is control for acquiring the output of the current sensor at startup of the vehicle system as an startup offset error β and then correcting the output of the current sensor by using the startup offset error β.

What is claimed is:

1. A control system for a battery that can store electric power for generating driving force of a vehicle, the vehicle being operable by a user, the control system comprising:
   a current sensor configured to detect a charge and discharge current of the battery; and
   an electronic control unit configured to;
   a) start up or stop in response to an operation conducted by the user,
   b) execute first correction control when a temperature of the current sensor at startup of the electronic control unit is higher than or equal to a threshold temperature, the first correction control being control for correcting an output of the current sensor by using a first error that is an offset error of the current sensor, the first error being calculated based on an output of the current sensor that the output is output just before a stop of the electronic control unit, and
   c) execute second correction control when the temperature of the current sensor at startup of the electronic control unit is lower than the threshold temperature, the second correction control being control for correcting an output of the current sensor by using a second error that is an offset error of the current sensor, the second error being determined based on an output of the current sensor that the output is output at startup of the electronic control unit.

2. The control system according to claim 1, wherein the output of the current sensor is a positive value during discharging of the battery, and the output of the current sensor is a negative value during charging of the battery,
   the first correction control is control for setting a value obtained by subtracting the first error from the output of the current sensor as a corrected charge and discharge current of the battery, the second correction control is control for setting a value obtained by subtracting the second error from the output of the current sensor as a corrected charge and discharge current of the battery, and the electronic control unit is configured to execute the second correction control when the temperature of the current sensor at startup of the electronic control unit is lower than the threshold temperature and the second error is smaller than the first error.

3. The control system according to claim 1, wherein the electronic control unit is configured to, when the temperature of the current sensor exceeds the threshold temperature during execution of the second correction control, stop the second correction control and execute the first correction control.

4. The control system according to claim 1, further comprising a temperature sensor configured to detect the temperature of the battery, wherein the electronic control unit is configured to estimate the temperature of the current sensor based on the output of the temperature sensor.

* * * * *